(12) United States Patent
Maglica et al.

(10) Patent No.: US 9,534,751 B2
(45) Date of Patent: *Jan. 3, 2017

(54) LED MODULE

(71) Applicant: Mag Instrument, Inc., Ontario, CA (US)

(72) Inventors: Anthony Maglica, Ontario, CA (US); Stacey H. West; Robert P. Radloff, Corona, CA (US)

(73) Assignee: MAG INSTRUMENTS, INC., Ontario, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 14/704,279

(22) Filed: May 5, 2015

(65) Prior Publication Data

US 2015/0300621 A1   Oct. 22, 2015

Related U.S. Application Data

(63) Continuation of application No. 12/188,201, filed on Aug. 7, 2008, now Pat. No. 9,022,612.

(51) Int. Cl.
*F21L 4/02* (2006.01)
*F21K 99/00* (2016.01)
(Continued)

(52) U.S. Cl.
CPC .............. *F21L 4/027* (2013.01); *F21K 9/00* (2013.01); *F21V 15/04* (2013.01); *F21V 23/005* (2013.01); *F21V 23/006* (2013.01); *F21V 23/04* (2013.01); *F21V 29/004* (2013.01); *F21V 29/507* (2015.01); *F21V 29/508* (2015.01); *F21V 29/70* (2015.01); *F21V 29/74* (2015.01);
(Continued)

(58) Field of Classification Search
CPC ............ F21L 4/027; F21K 9/00; F21V 15/04; F21V 23/04; F21V 23/005; F21V 23/006; F21V 29/004; F21V 29/70; F21V 29/74; F21V 29/89; F21V 29/507; F21V 29/508; F21W 2101/10; F21W 2111/10; F21Y 2101/02; H05K 1/0206; H05K 1/0207; H05K 3/429; H05K 2201/09309; H05K 2201/09518; H05K 2201/10106
See application file for complete search history.

(56) References Cited

U.S. PATENT DOCUMENTS

| | | | |
|---|---|---|---|
| 7,083,305 B2 * | 8/2006 | Galli | F21L 4/027 362/294 |
| 9,022,612 B2 * | 5/2015 | Maglica | F21K 9/00 362/249.02 |

* cited by examiner

*Primary Examiner* — Stephen F Husar

(57) ABSTRACT

A light emitting diode ("LED") module with improved thermal characteristics is provided. The module includes an LED, a first circuit board, a second circuit board, a lower insulator, an upper insulator, a lower contact, upper contacts, and a heat sink. Preferably, the heat sink comprises an outer housing and a contact ring. The LED and the heat sink are attached to the first circuit board via solder. In addition to serving as a substrate for the LED, the first circuit board (which contains a plurality of thermally conductive layers connected by vias) facilitates the transfer of heat away from the LED to the heat sink. The module also has improved mechanical and electrical properties, including redundant electrical connections, stable mechanical connections, and a shock-absorbing lower contact. The lower insulator can also be configured to prevent misalignment of the power source with the lower contact when the module is used in a flashlight or other lighting device.

20 Claims, 20 Drawing Sheets

(51) Int. Cl.

| | |
|---|---|
| *F21V 15/04* | (2006.01) |
| *F21V 23/04* | (2006.01) |
| *F21V 29/00* | (2015.01) |
| *F21V 23/00* | (2015.01) |
| *F21V 29/507* | (2015.01) |
| *F21V 29/74* | (2015.01) |
| *F21V 29/89* | (2015.01) |
| *F21V 29/508* | (2015.01) |
| *F21V 29/70* | (2015.01) |
| *H05K 1/02* | (2006.01) |
| *H05K 3/42* | (2006.01) |
| *F21W 101/10* | (2006.01) |
| *F21W 111/10* | (2006.01) |
| *F21Y 101/00* | (2016.01) |

(52) U.S. Cl.
CPC ........... *F21V 29/89* (2015.01); *H05K 1/0207* (2013.01); *F21W 2101/10* (2013.01); *F21W 2111/10* (2013.01); *F21Y 2101/00* (2013.01); *H05K 1/0206* (2013.01); *H05K 3/429* (2013.01); *H05K 2201/09309* (2013.01); *H05K 2201/09518* (2013.01); *H05K 2201/10106* (2013.01)

LED MODULE

CROSS-REFERENCE TO RELATED APPLICATION

The application is a continuation of application Ser. No. 12/188,201, filed Aug. 7, 2008, now U.S. Pat. No. 9,022,612, issued May 5, 2015, the contents of which are incorporated by reference as if fully set forth herein.

FIELD OF THE INVENTION

The field of the present invention relates to a light emitting diode ("LED") module, and pertains particularly to an LED module for use in hand-held and other portable lighting devices, such as flashlights and headlamps.

BACKGROUND OF THE INVENTION

LEDs have been used in various applications, including illuminating watches, transmitting information from remote controls, and forming images on jumbo television screens. More recently, LEDs have been used in portable lighting devices (such as flashlights and headlamps) because, among other things, LEDs can last longer, produce light more efficiently, and be more durable than incandescent lamps commonly used in conventional flashlights and headlamps.

However, the brightness and expected life of an LED typically decreases with increased temperature. Effective dissipation of heat is therefore needed to maintain the temperature of the LED within its design limits.

Further, a limitation on many LED modules is the medium used to affix the LED to its supporting substrate. Current LED modules use a thermal epoxy or other similar substance. Thermal epoxies are difficult to work with and require extended cure times. LED attachments using thermal epoxies also have an increased incidence of premature failure.

Another limitation on many LED modules, especially those intended for use in flashlights and other portable lighting devices, is their inability to prevent operation of the lighting device when the power source (e.g., one or more batteries) are incorrectly aligned.

A further limitation on known LED modules, such as described in U.S. Patent Publication 2007/0058366 A1 (published Mar. 15, 2007), has been their relative complexity of assembly or manufacture.

Finally, another limitation on many LED modules used in portable lighting devices is their susceptibility to failure caused by electrical interruptions and/or shock from outside forces.

In view of the foregoing limitations on current LED modules, an object of the present invention is to provide an improved LED module that at least partially ameliorates one or more of the foregoing problems in the art.

SUMMARY OF THE INVENTION

To the above end, in a preferred embodiment, the LED module is provided comprising an LED, a first circuit board, a lower assembly formed by a lower contact and a lower insulator, a second circuit board, an upper assembly formed by an upper insulator and upper contacts, and a heat sink formed by an outer housing and a contact ring. The LED and the heat sink are affixed to the first circuit board, preferably via a solder connection. The first circuit board, which has a plurality of thermally conductive layers connected by thermal vias, promotes the rapid and efficient transfer of heat from the LED to the heat sink.

In the preferred embodiment, the LED module also provides for a bond between the LED and the first circuit board, as well as bond between the first circuit board and the heat sink, that exhibit improved thermal, electrical, and mechanical characteristics, and that are less susceptible to premature failure.

In the preferred embodiment, the LED module also provides for protection against incorrect insertion or alignment of the power source that supplies energy to the LED, as well as improved mechanical stability and shock resistance to outside forces.

In the preferred embodiment, the LED module also provides for redundancy in the channels of electrical communication between components, thereby rendering the module less susceptible to failure from electrical interruptions.

In the preferred embodiment, the LED module also provides for an improved assembly that tolerates larger mechanical tolerances, that eliminates cure times, and that has increased flexibility in the orientation of its constituent components.

Further aspects, objects, desirable features, and advantages of the LED module will be better understood from the following description, considered in connection with the accompanying drawings in which the preferred embodiment of the LED module is illustrated by way of example. It is to be expressly understood, however, that the drawings are for the purpose of illustration only and are not intended as a definition of the limits of the invention.

DETAILED DESCRIPTION OF THE PREFERRED EMBODIMENTS

Figure 1:
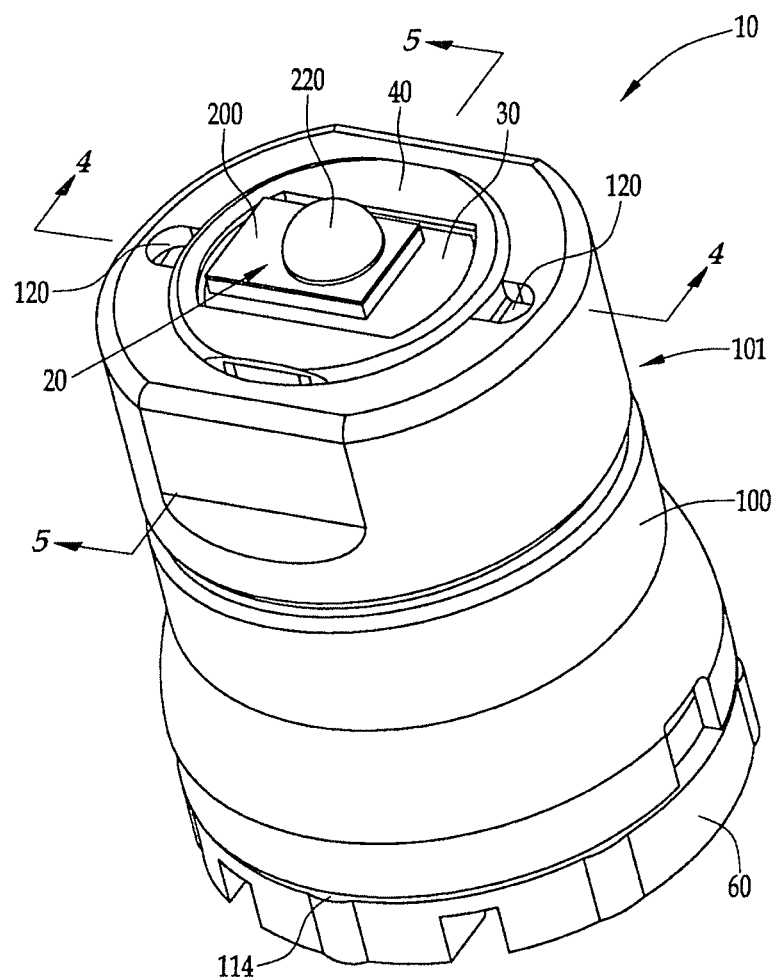
FIG. 1 is a perspective view of the LED module.
Figure 2:
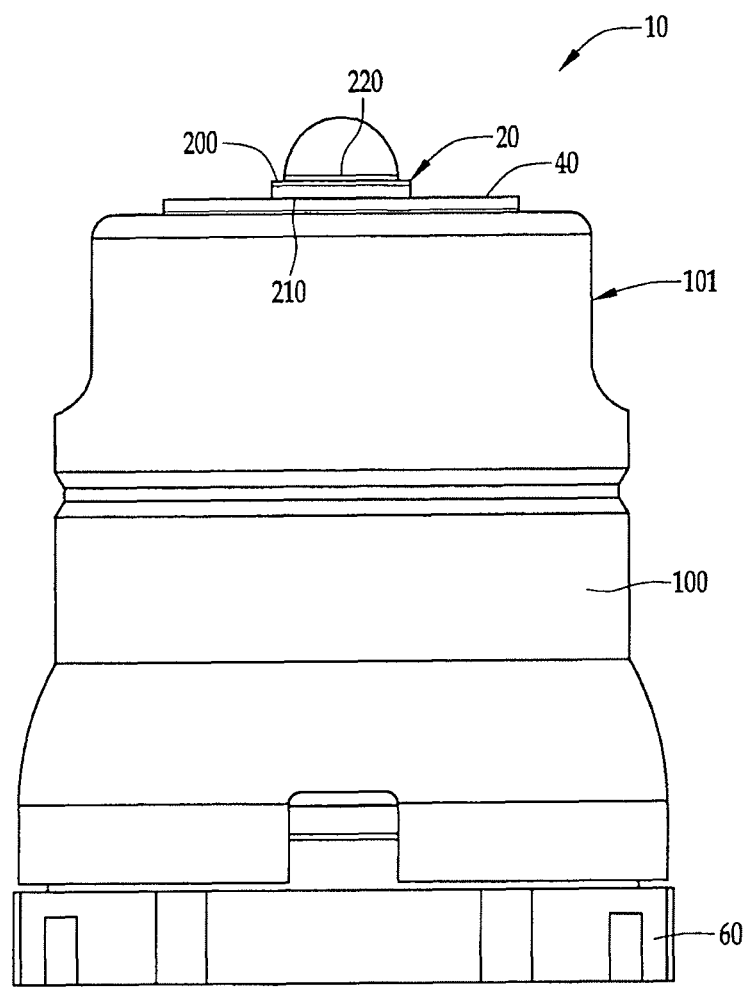
FIG. 2 is a side view of the LED module.
Figure 3:
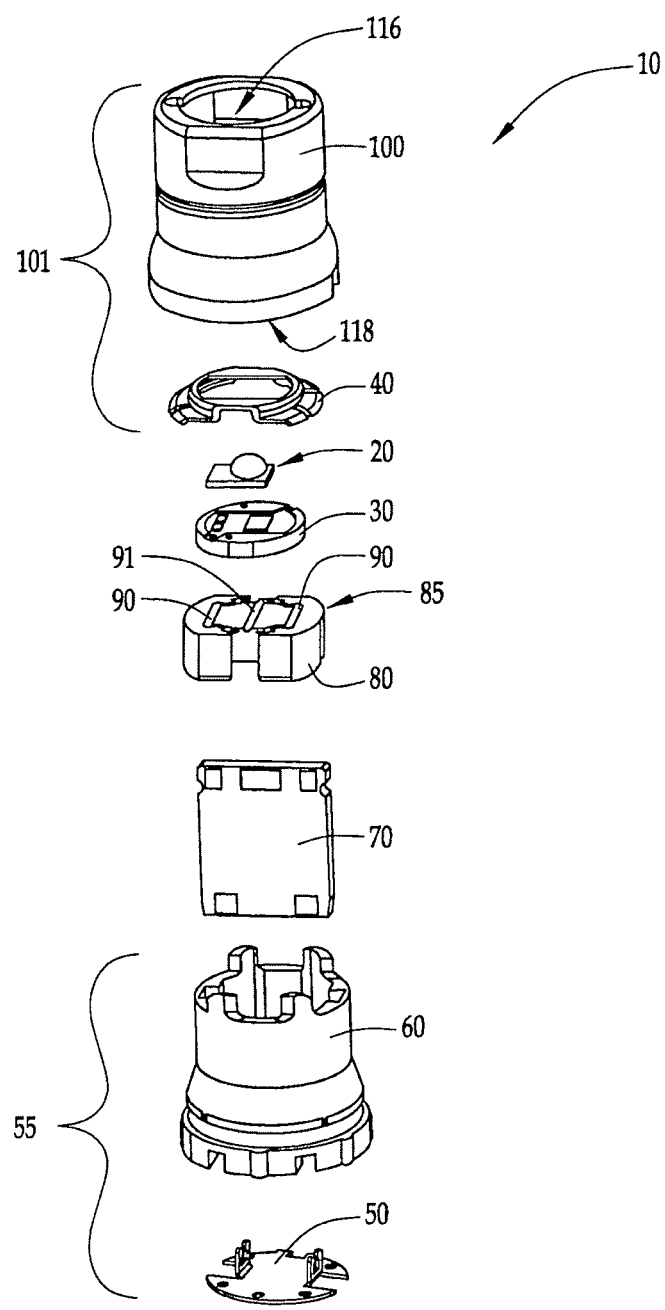
FIG. 3 is an exploded view showing the components of the LED module prior to assembly.

An LED module 10, according to a preferred embodiment, is shown in FIGS. 1-5. In the illustrated embodiment, the LED module 10 includes an LED 20, a first circuit board 30, a lower assembly 55 formed by a lower contact 50 and a lower insulator 60, a second circuit board 70, an upper assembly 85 formed by an upper insulator 80 and upper contacts 90, 91, and a heat sink 101 formed by an outer housing 100, preferably made of metal, and a contact ring 40.

The LED 20 can be any light emitting diode that can be soldered to a printed circuit board. Preferably the LED 20 can be soldered to the first circuit board 30 using a screen applied solder paste and a reflow oven. More preferably, the LED 20 is the LUXEON® Rebel product commercially available from Philips Lumileds Lighting Company, LLC. The LED 20 has an upper surface 200 and a lower surface 210. The upper surface 200 has a diode 220 that is capable of emitting visible light in a direction away from the upper surface 200. The lower surface 210 has a positive contact and a negative contact (not shown) that are in electrical communication with the diode 220 in a conventional manner. The lower surface 210 also has a heat pad (not shown) that is in thermal communication with the diode 220.

Figure 6:
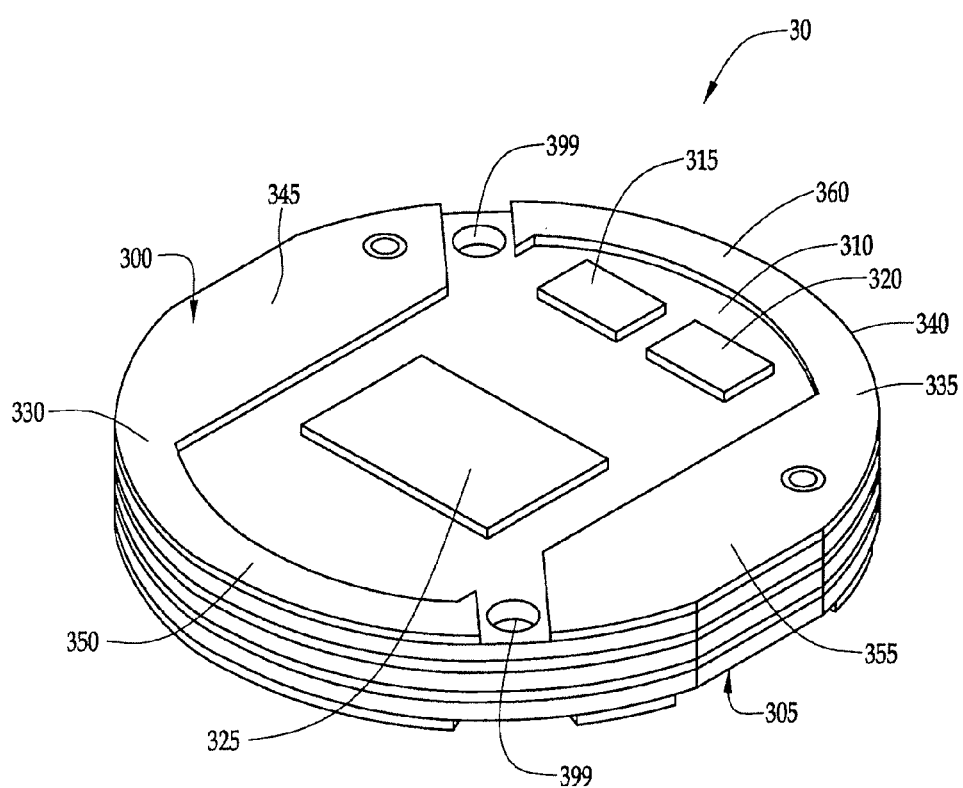
FIG. 6 is a perspective view of the first circuit board of FIG. 3.
Figure 7:
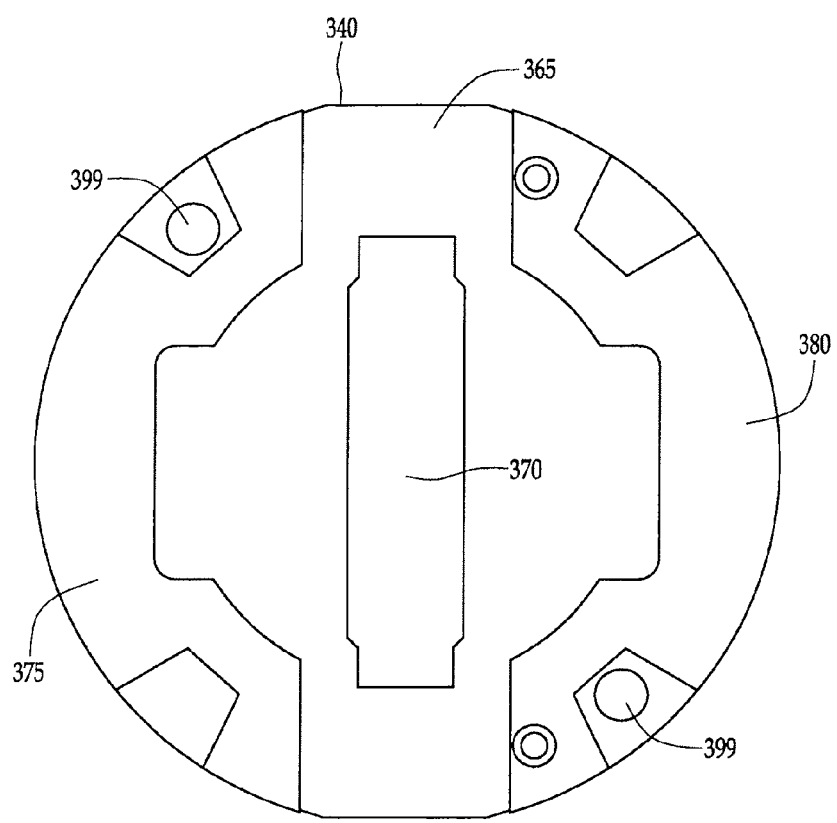
FIG. 7 is a bottom view of the first circuit board of FIG. 3.
Figure 8:
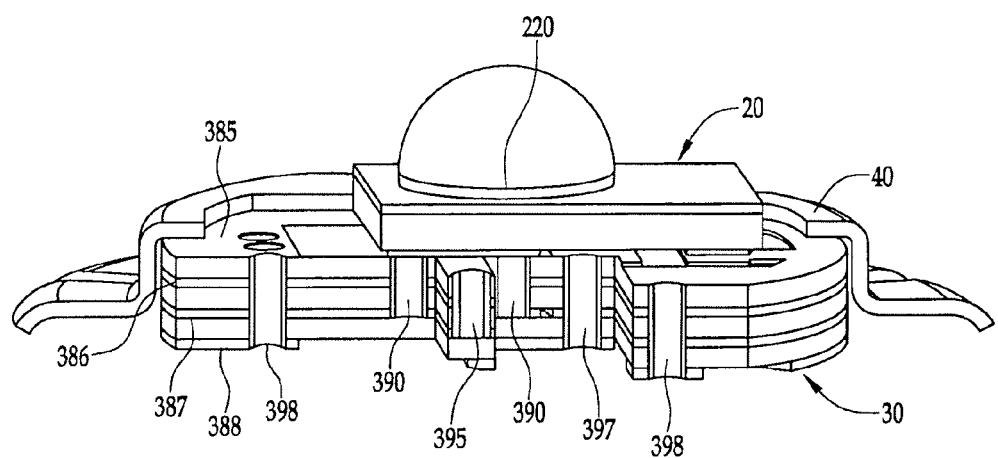
FIG. 8 is a multi-plane cross-sectional view of the first circuit board, LED, and contact ring.

FIGS. 6-8 illustrate one embodiment of the first circuit board 30. In the present embodiment, the first circuit board 30 is generally circular in shape. The first circuit board 30 has an upper surface 300 and a lower surface 305. The first circuit board 30 is preferably about 5/16" in diameter, less than 1/16" in thickness, and is preferably formed from a metal clad printed circuit board. The first circuit board 30 serves three primary functions. First, it functions as a substrate for supporting the LED 20. Second, it functions as a thermal conductor for transferring heat away from the LED 20 to the contact ring 40 of heat sink 101. Third, it functions as part of the electrical circuit of the flashlight. In particular, one conductor of the first circuit board 30 electrically connects one terminal, preferably the positive terminal, of the LED 20 to the lower contact 50 via upper contact 91 and the second circuit board 70, and a second conductor of the first circuit board 30 electrically connects a second terminal of LED 20, preferably the negative terminal, to the outer housing 100 via contact ring 40.

As shown in FIG. 6, the upper surface 300 is defined, in part, by a non-electrically conducting substrate 310. Further, in the preferred embodiment, the upper surface 300 includes a relatively small and rectangular shaped positive terminal 315, a relatively small and rectangular shaped negative terminal 320, and a relatively large and rectangular shaped thermal pad 325. Other pad shapes are possible.

The upper surface 300 also includes first and second generally "L" shaped landings 330, 335 located about the periphery near the outer edge 340 of the first circuit board 30. The first landing 330, which occupies just under half of the periphery, has a wide region 345 and a narrow region 350. The second landing 335, which also occupies just under half of the periphery, also has a wide region 355 and a narrow region 360. The wide regions 345, 355 are located opposite each other. Similarly, the narrow regions 350, 360 are located opposite each other. Both the first and the second landings 330, 335 are in electrical communication with the negative terminal 320 and the thermal pad 325. The positive terminal 315 is electrically isolated from the remainder of the upper surface 300.

As shown in FIG. 7, the lower surface 305 is also defined, in part, by a non-electrically conducting substrate 365. Further, the lower surface 305 includes, in the preferred embodiment, a rectangular shaped positive terminal 370. The positive terminal 370 is positioned near the center of the lower surface 305, with its longitudinal axis aligned in the same direction as the longitudinal axis of the thermal pad 325 on the upper surface 300. No portion of the positive terminal 370 reaches the outer edge 340 of the first circuit board 30.

The lower surface 305 also includes two additional pad areas. The first is a generally "C" shaped negative terminal 375, which occupies just under half of the periphery, near the outer edge 340. The second is another generally "C" shaped negative terminal 380, which also occupies just under half of the periphery, near the outer edge 340. The portions of the non-electrically conducting substrate 365 on the lower surface 305 that extend to the outer edge 340 are located below the wide regions 345, 355 of the generally "L" shaped landings 330, 335 on the upper surface 300.

The lower surface 210 of the LED 20 is attached to the upper surface 300 of the first circuit board 30 by a screen applied solder paste, which is then sent through a reflow oven. The lower surface 210 of the LED 20 is oriented relative to the upper surface 300 of the first circuit board 30 so that the heat pad of the LED 20 is positioned above the thermal pad 325, the positive contact of the LED 20 is positioned above the positive terminal 315, and the negative contact of the LED 20 is positioned above the negative terminal 320. The positive contact on the lower surface 210 of the LED 20 is therefore in electrical communication with the positive terminal 315 on the upper surface 300 of the first circuit board 30, and the negative contact on the lower surface 210 of the LED 20 is in electrical communication with the negative terminal 320 on the upper surface 300 of the first circuit board 30. Further, the diode 220 on the upper surface 200 of the LED 20 is in thermal communication with the thermal pad 325 on the upper surface 300 of the first circuit board 30 via the heat pad on the lower surface 210 of the LED 20.

The use of a screen applied solder paste, instead of a thermal epoxy or other similar material, to attach the LED 20 to the first circuit board 30 increases the efficiency of the heat transfer between these structures. It also simplifies and increases the speed of the assembly process by eliminating the need to work with adhesive substances and cure times. Further, the strength of the solder connection reduces the likelihood of premature failure of this attachment, given the tendency of thermal epoxy to become brittle over time.

As shown in FIG. 8, the first circuit board 30 preferably includes multiple parallel layers of a thermally conductive material, preferably a metal such as copper. More preferably, these layers contain 4 ounce copper. The first circuit board 30, preferably, has four such layers 385-388. Blind thermal vias 390, 395 thermally connect all but the lowermost copper content layer 388. A plurality of these blind vias 390 are located in the vicinity of the thermal pad 325. These blind vias 390 draw heat away from the diode 220, through the thermal pad 325, and into the high copper content layers 385-387. A plurality of the blind thermal vias 395 are also located in the vicinity of the first and second landings 330, 335, with particular focus on the wide regions 345, 355 thereof. The blind vias 395 draw heat out of the high copper content layers 385-387 and into the first and second landings 330, 335.

The first circuit board 30 also includes electrical through vias 397, 398 that connect all of the copper content layers 385-387. At least one electrical through via 397 connects the positive terminal 315 on the upper surface 300 with the positive terminal 370 on the lower surface 305. Further, at least one electrical through via 398 connects the negative terminal 320 on the upper surface 300 with each of the negative terminals 375 & 380 on the lower surface 305.

The first circuit board 30 may also include alignment holes 399 that run from the upper surface 300, through the entire thickness of the board, to the lower surface 305. These alignment holes 399 are preferably located on the periphery of the first circuit board 30 between the first and second landings 330, 335, and may be used to align the first circuit board 30 relative to the upper insulator 80 and upper contacts 90, 91.

Figure 9:
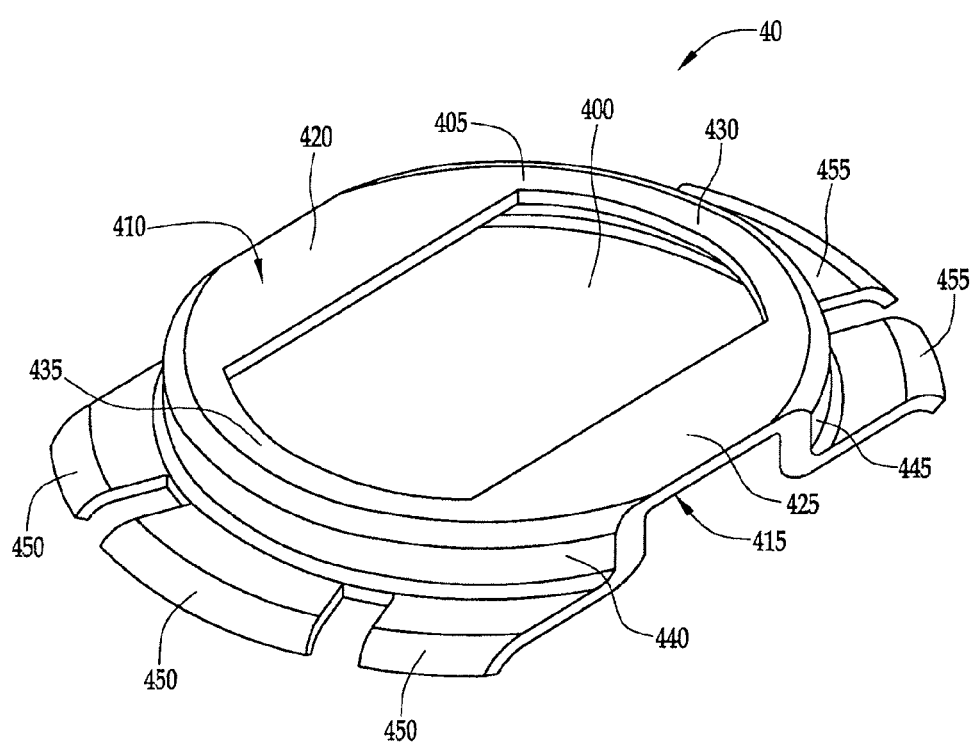
FIG. 9 is a perspective view of the contact ring of FIG. 3.

FIG. 9 illustrates the contact ring 40 of the preferred embodiment. The contact ring 40 forms part of the heat sink 101 in the present embodiment. The contact ring 40 is generally oval shaped with an oblong central cavity 400 and a raised main body 405 having an upper surface 410 and a lower surface 415. The main body 405 comprises a first wide portion 420, a second wide portion 425 (opposite the width of the central cavity 400 from the first wide portion 420), a first narrow portion 430, and a second narrow portion 435 (opposite the length of the central cavity 400 from the first narrow portion 430). The contact ring 40 also has a first side portion 440 (attached to the first narrow portion 430 of the raised main body 405), a second side portion 445 (attached to the second narrow portion 435), and multiple fins 450, 455 (attached, respectively, to side portions 440, 445). The side portions 440, 445 are generally oriented perpendicular to the main body 405 and extend downward and away from the lower surface 415 of the main body 405. The fins 450, 455 are generally oriented perpendicular to the side portions 440, 445 and extend away from the side portions 440, 445 and the main body 405.

The lower surface 415 of the main body 405 is preferably attached to the landings 330, 335 on the upper surface 300 of the first circuit board 30 by a screen applied solder paste, which is then sent through a reflow oven. This occurs, preferably, at the same time the lower surface 210 of the LED 20 is attached to the upper surface 300 of the first circuit board 30. The lower surface 415 of the main body 405 is oriented relative to the upper surface 300 of the first circuit board 30 so that the LED 20 is positioned within the central cavity 400. Additionally, the central cavity 400 is large enough so that the positive contact on the lower surface 210 of the LED 20 and the positive terminal 315 on the upper surface 300 of the first circuit board 30 are electrically isolated from the contact ring 40 by non-electrically conducting substrate 310.

The lower surface 415 of the main body 405 is oriented relative to the upper surface 300 of the first circuit board 30 so that the first wide portion 420 of the main body 405 is located directly above the first wide region 345 on the upper surface 300 of the first circuit board 30, the second wide portion 425 of the main body 405 is located directly above the second wide region 355 on the upper surface 300 of the first circuit board 30, the first narrow portion 430 of the main body 405 is located directly above the first narrow region 350 on the upper surface 300 of the first circuit board 30, and the second narrow portion 435 of the main body 405 is located directly above the second narrow region 360 on the upper surface 300 of the first circuit board 30. The first wide portion 420 is therefore in thermal and electrical communication with the first wide region 345, the second wide portion 425 is in thermal and electrical communication with the second wide region 355, the first narrow portion 430 is in thermal and electrical communication with the first narrow region 350, and the second narrow portion 435 is in thermal and electrical communication with the second narrow region 360.

It is to be understood, however, that the above configuration of the contact ring 40 relative to the upper surface 300 of the first circuit board 30 is not meant to be limiting. For example, other shapes of landings and contact rings may also be suitably employed. The main directive is to transfer heat from the first circuit board 30 to the contact ring 40. In the illustrated configuration, heat is transferred from the wide regions 345, 355 of the first and second landings 330, 335 to the wide portions 420, 425 of the main body 405. From the wide portions 420, 425 of the main body 405, heat is then transferred to the first and second side portions 440, 445, and then to the multiple fins 450, 455 emanating outward from both side portions 440, 445.

The contact ring 40 is preferably made from a single piece of beryllium copper, or another electrically and thermally conductive material.

Figure 10:
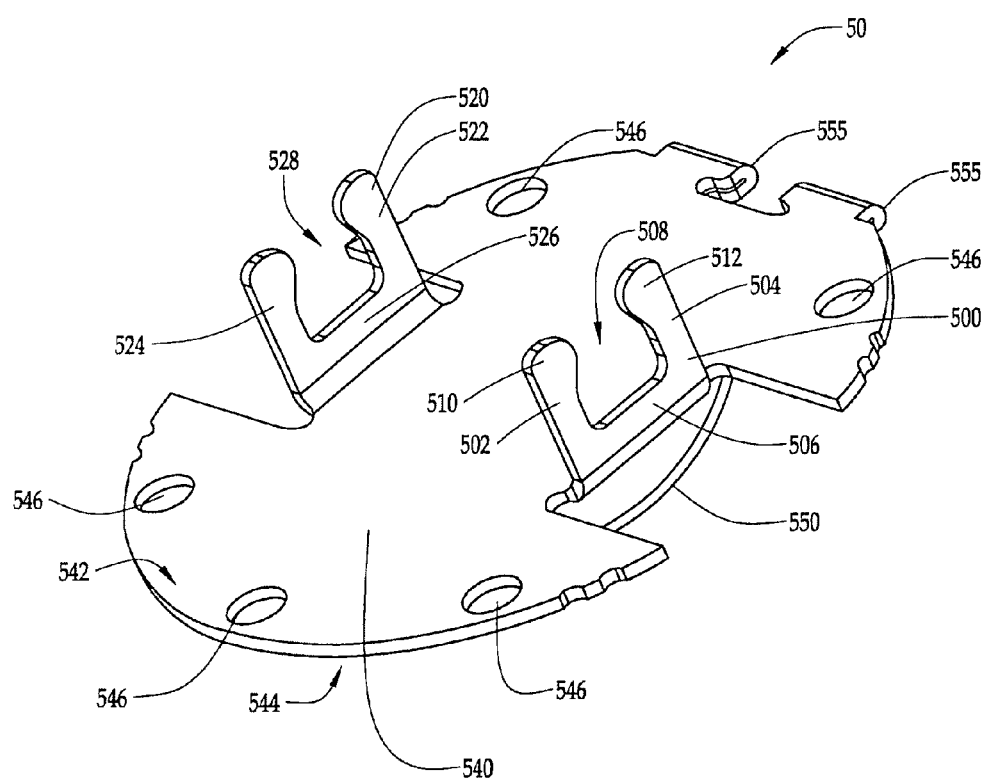
FIG. 10 is a perspective view of the lower contact of FIG. 3.

FIG. 10 illustrates the lower contact 50 of the present embodiment. The lower contact 50 has a first circuit board gripping element 500, a second circuit board gripping element 520, a main portion 540, and a leaf spring 550. The first circuit board gripping element 500, second circuit board gripping element 520, main portion 540, and leaf spring 550 are all in electrical communication with each other, and preferably formed from beryllium copper sheet stock.

The first circuit board gripping element 500 comprises a first prong 502, a second prong 504, and a base 506. The first and second prongs 502, 504, in conjunction with the base 506, define an interstitial space 508. The interstitial space 508 is open in the direction opposite the base 506. The first and second prongs 502, 504 preferably widen, inwardly toward the interstitial space 508, as they propagate away from the base 506. This results in a narrowing of the interstitial space 508 near the ends 510 & 512 of the prongs 502, 504. Thus, any portion of a circuit board of sufficient width inserted into the interstitial space 508 can be mechanically held in place by the first and second prongs 502, 504 and can be supported by the base 506. The ends 510, 512 of the prongs 502, 504 are also preferably rounded, so as to facilitate the insertion of at least a portion of a circuit board between the first and second prongs 502, 504 and into the interstitial space 508.

The second circuit board gripping element 520 is identical to the first circuit board gripping element 500, and has a first prong 522, a second prong 524, and a base 526. The first and second prongs 522, 524, in conjunction with the base 526, form an interstitial space 528.

The main portion 540 of the lower contact 50 is preferably substantially circular in shape, with upper 542 and lower 544 surfaces, and is perforated by several holes 546. These holes 546 provide flow paths when the lower insulator 60 is injection molded around the lower contact 50, and help mechanically lock the lower contact 50 to the lower insulator 60. The first and second circuit board gripping elements 500, 520 are in physical contact with the main portion 540 and are preferably separated by a distance equal to half the diameter of the main portion 540. The first and second circuit board gripping elements 500, 520 are oriented perpendicular to the upper surface 542, with the ends of the prongs extending away from the upper surface 542 and the interstitial spaces 508, 528 in alignment with each other. In this configuration, a printed circuit board held in place by the first and second circuit board gripping elements 500, 520 would be oriented perpendicular to, and would extend away from, the upper surface 542.

The leaf spring 550 is positioned adjacent to the lower surface 544 of the lower contact 50. It preferably takes a convex "U" shaped form. The first end 554 is connected to the main portion 540 at creases 555. Further, the leaf spring 550 is preferably formed so that the second end 552 is in physical contact with the lower surface 544 when the spring is in an unbiased state, but with the remainder of the leaf spring 550 spaced apart from the lower surface 544 (with the maximum separation approximately halfway between the first and second ends 554, 552). The leaf spring 550 is therefore capable of electrically communicating with the anode terminal of a battery, while still providing some degree of shock absorbance if the anode terminal is accelerated toward the leaf spring 550. Alternatively, in portable lighting devices where the LED module 10 is not in direct contact with the anode terminal of a battery, the leaf spring 550 of lower contact 50 helps ensure electrical contact is established and maintained with an adjacent conductive element forming part of the main power circuit of the lighting device.

The lower contact 50 is preferably made from a single piece of beryllium copper, or another suitable electrically conductive material.

Figure 11:
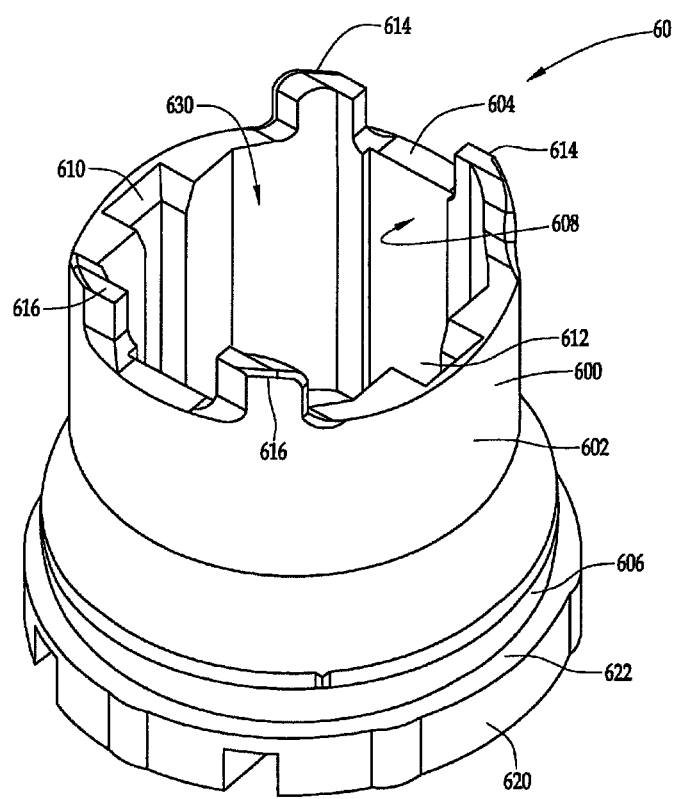
FIG. 11 is a perspective view of the lower insulator of FIG. 3.
Figure 12:
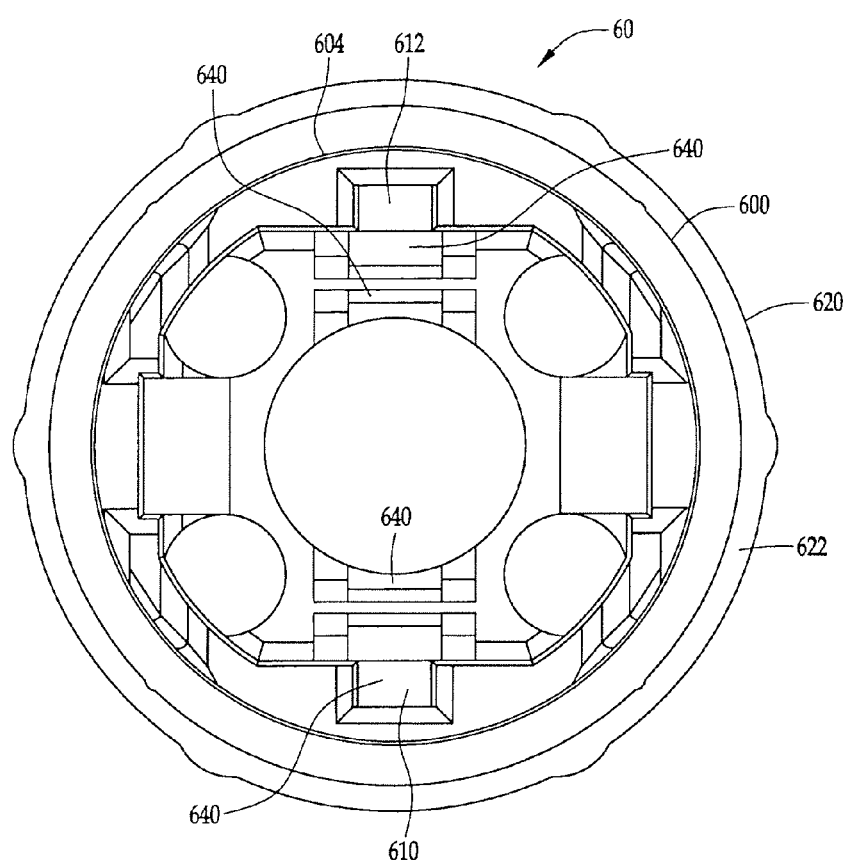
FIG. 12 is a top view of the lower insulator of FIG. 3.

FIGS. 11-12 illustrate the lower insulator 60 of the preferred embodiment. The lower insulator 60 is formed from a non-electrically and non-thermally conductive material, preferably a liquid crystal polymer that is capable of withstanding elevated temperature. The lower insulator 60 is preferably injection molded around the lower contact 50, forming the lower assembly 55 (comprising the lower insulator 60 and the lower contact 50).

The lower insulator has a circumferential wall 600 and a base 620, which together form a central cavity 630. The central cavity 630 is open in the direction opposite the base 620.

The outer surface 602 of the circumferential wall 600, extending downward from its upper edge 604, is substantially circular in shape, with a generally uniform diameter. However, at the approximate midway point between the upper edge 604 and the base 620, the outer surface 602 of the circumferential wall 600 gradually increases in diameter. This gradual increase in the diameter of the outer surface 602 of the circumferential wall 600 continues until just prior to the base 620. At that point, the diameter of the outer surface 602 of the circumferential wall 600 abruptly decreases, and remains uniform until reaching the base 620, thereby forming a circumferential groove 606.

Below the circumferential groove 606 is the base 620. The base 620 is also substantially circular in shape, with a generally uniform diameter. However, the diameter of the base 620 is greater than any portion of the circumferential wall 600. It therefore forms a circumferential ledge 622 where the top of the base 620 meets the bottom of the circumferential groove 606.

Figure 13:
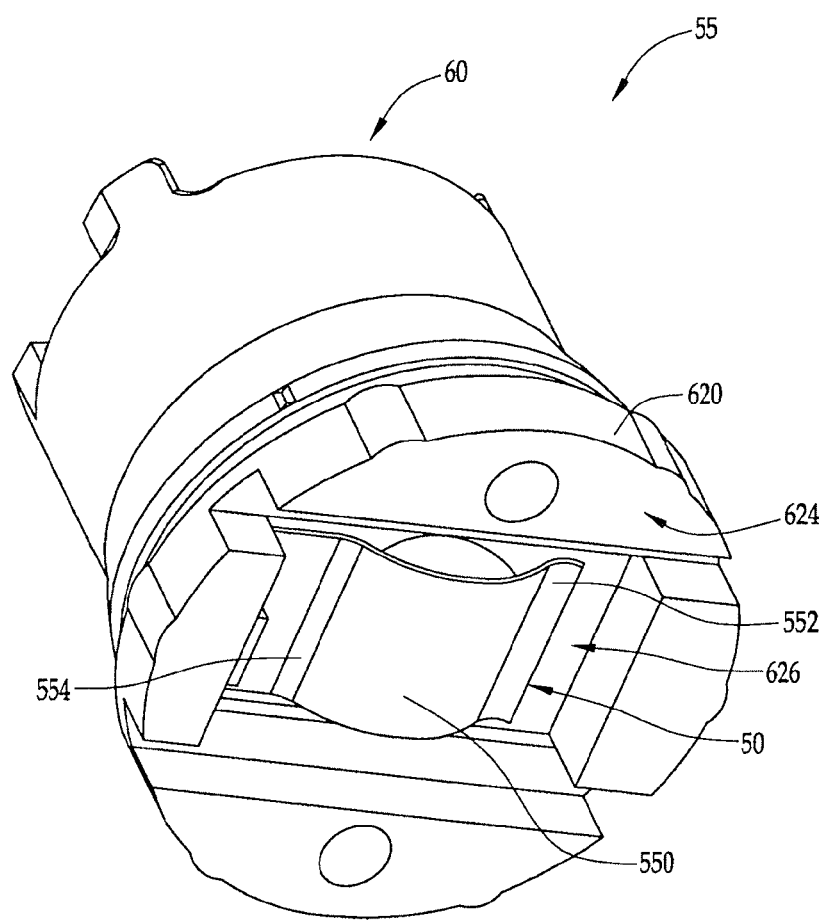
FIG. 13 is a bottom view of the lower insulator and the lower contact.

As best seen in FIG. 13, the lower surface 624 of the base 620 has a recessed area 626 that houses the leaf spring 550 of the lower contact 50 after molding of the lower assembly 55 is completed. The leaf spring 550 is positioned in the recessed area 626 so that no portion of the leaf spring 550 extends outward to or beyond the plane formed by the lower surface 624 of the base. This feature may act as an anti-polarity device in portable lighting devices in which the LED module 10 is intended to be directly connected to the anode of a battery. In other words, if a power source (such as a battery) is placed within the body of a lighting device with a non-anode (e.g., cathode) terminal facing the lower surface 624 of the base, the LED lighting module 10 of the preferred embodiment will not receive electrical energy from the power source. However, when the power source is properly placed within the body of a lighting device, or in other applications where the LED module 10 is not intended to be in physical contact with the power source, this feature may also help prevent damage to the module by the mating conductive element in the event that the lighting device is dropped or otherwise receives a significant impact.

Figure 4:
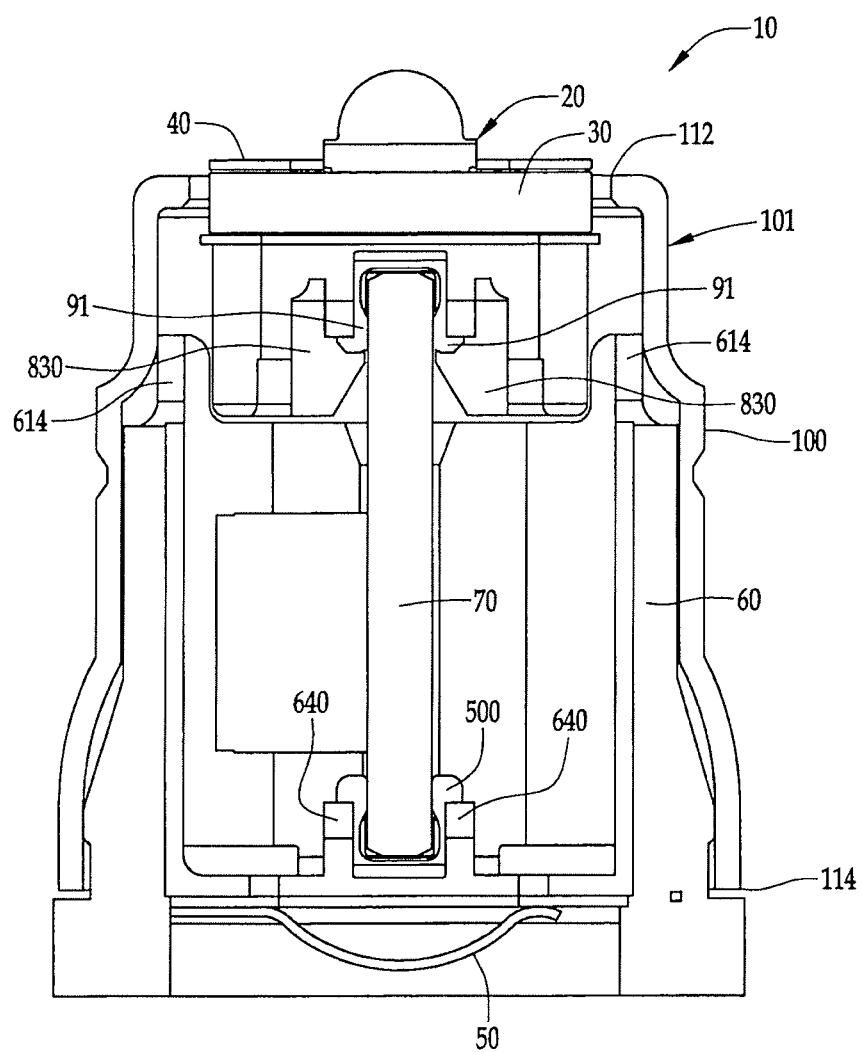
FIG. 4 is a longitudinal cross-sectional view of the LED module of FIG. 1, as seen along the plane 4-4 in FIG. 1.
Figure 5:
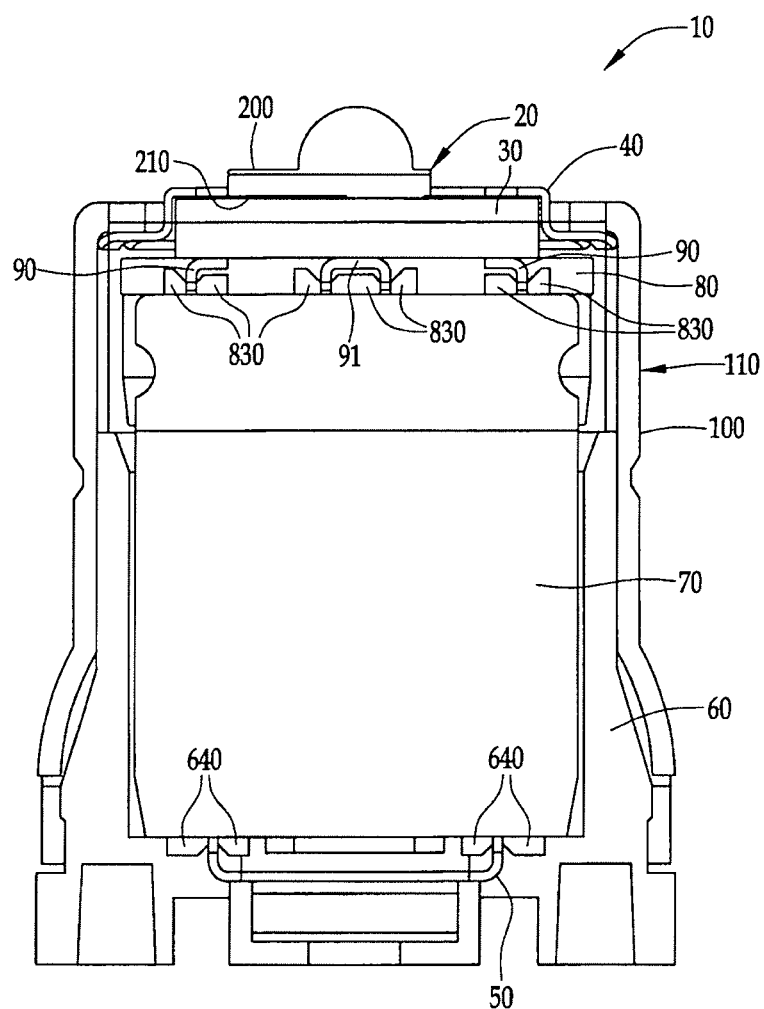
FIG. 5 is a longitudinal cross-sectional view of the LED module of FIG. 1, as seen along the plane 5-5 in FIG. 1.

After molding of the lower assembly 55 is completed, the first and second circuit board gripping elements 500, 520, respectively, of the lower contact 50 protrude into the central cavity 630, as best seen in FIG. 4. It is to be understood, however, that the illustrated orientation of the first and second circuit board gripping elements 500, 520 relative to the lower insulator 60 is not meant to be limiting.

The base also has support elements 640, that protrude into the central cavity 630, and that prevent the first and second circuit board gripping elements 500, 520 from being bent to the side when the second circuit board 70 is inserted therein.

The inner surface 608 of the circumferential wall 600, preferably, has an irregular diameter. For example, the inner surface 608 preferably has a first vertical groove 610 and a second vertical groove 612, located opposite each other. After molding of the lower assembly 85 is completed, these first and second vertical grooves 610, 612 are aligned with the interstitial spaces 508, 528 of the circuit board gripping elements 500, 520. As a result, the second printed circuit board 70 retained by the circuit board gripping elements 500, 520 is not only supported in place by the circuit board gripping elements 500, 520, but also by the vertical grooves 610, 612. Further, by reducing the width of the circumferential wall 600 in the vicinity of the first and second vertical grooves 610, 612, a larger circuit board can be inserted into the central cavity 630 without having to increase the diameter of the outer surface 602.

The upper edge 604 of the circumferential wall 600 preferably comprises a first pair of prongs 614 and a second pair of prongs 616 that extend upwardly in the direction away from the base. The first pair of prongs 614 are generally aligned with the prongs 502, 504 of the first circuit board gripping element 500, with one of the pair on either side of the first circuit board gripping element 500. The second pair of prongs 616 are generally aligned with the prongs 522, 524 of the second circuit board gripping element 520, with one of the pair on either side of the second circuit board gripping element 520. There are no prongs in the vicinity of the vertical grooves 610, 612. As described in more detail below, the prongs assist in the alignment of the lower insulator 60 and the upper assembly 85 during assembly of the LED module 10, thereby preventing (or at least minimizing) the twisting of the second printed circuit board 70.

Figure 14:
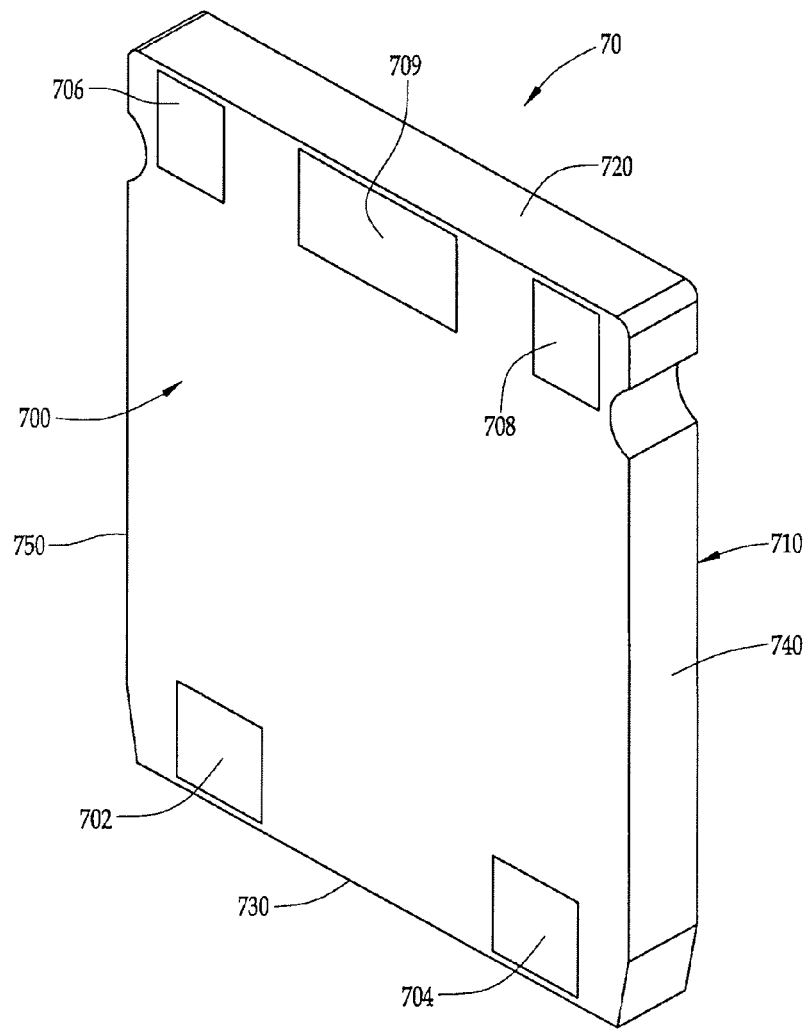
FIG. 14 is a perspective view of the second circuit board of FIG. 3.
Figure 15:
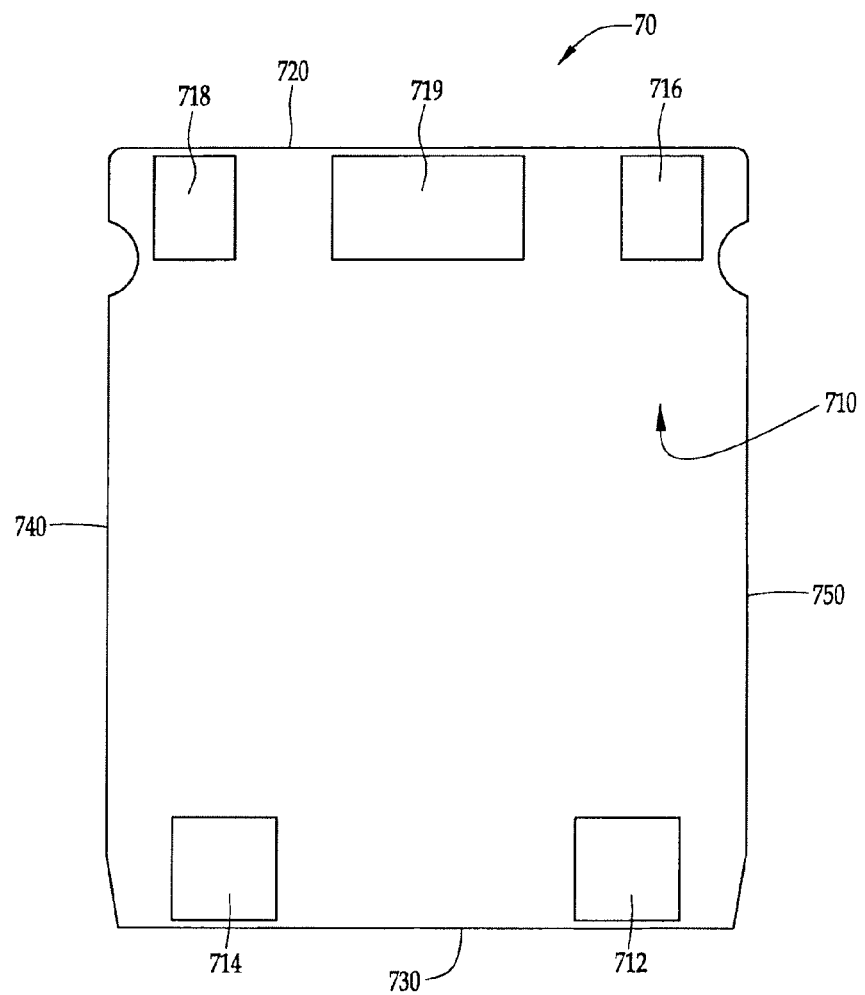
FIG. 15 is a side view of the second circuit board of FIG. 3.

The second circuit board 70 of the preferred embodiment is now described. As seen in FIG. 14, the second circuit board 70 is generally rectangular in shape. It has a first side 700, a second side 710, an upper edge 720, a lower edge 730, a first side edge 740, and a second side edge 750. The second circuit board 70 is preferably ½" in length along the first and second side edges 740, 750, ⅜" in width along the upper and lower edges 720, 730, and less than ¹⁄₁₆" in thickness. The second circuit board 70 acts as the LED driver board and is configured to regulate the current delivered to the LED 20, preferably based on the temperature of the LED 20. It can also serve additional functions, such as an electronic switch. Energy regulating circuits that can be incorporated on the second circuit board 70, and that are capable of regulating the energy delivered to the LED 20 based on the sensed temperature of the LED 20, are described in U.S. Patent Publication 2007/0058366A1 (published Mar. 15, 2007), which description is hereby incorporated by reference.

The second circuit board 70 has a first lower contact pad 702 and a second lower contact pad 704. The lower contact pads 702, 704 are generally rectangular in shape and are located on the first side 700 of the second circuit board 70. Largely identical first and second lower contact pads 712, 714 are also located on the second side 710 of the second circuit board 70. The first and second pairs of lower contact pads 702, 712 and 704, 714 are positioned near the lower edge 730 of the second circuit board 70 at approximately equal distances from the side edges 740, 750.

The second circuit board 70 can be connected to the lower contact 50 by inserting the lower edge 730 of the second circuit board 70 into the central cavity 630 of the lower insulator 60 so that one of the side edges 740, 750 of the second circuit board 70 mates with one of the vertical grooves 610, 612 in the lower insulator 60, while the other side edge mates with the other vertical groove. Upon full insertion, one pair of the lower contact pads 702, 712 and 704, 714 will be engaged by the prongs of one of the circuit board gripping elements 500, 520 of the lower contact 50, while the other pair of lower contact pads will eventually be engaged by the prongs of the other circuit board gripping element of the lower contact 50. At that point, the lower contact pads 702, 712 and 704, 714 are in physical contact and electrical communication with the lower contact 50. Further, the lower circuit board gripping elements 500, 520 grip the second circuit board through an interference type contact.

The assembly process is simplified because the lower contact pads 702,712 and 704,714 are, preferably, substantially larger than the width of the first and second circuit board gripping elements 500, 520 of the lower contact 50. Manufacturing tolerances, therefore, need not be as stringent. Further, as the lower contact pads are a mirror image of one another, the second circuit board 70 may be inserted in either of the two possible orientations in which lower contact pads 702,712 and 704,714 of second circuit board 70 are inserted first into the lower insulator 60.

The physical connection between the second circuit board 70 and the lower contact 50 also has increased stability. In particular, the first and second circuit board gripping elements 500, 520 of the lower contact 50 are spaced apart from each other, on opposite sides of the second circuit board's 70 longitudinal centerline. Stability is also increased by the interaction between the side edges 740, 750 of the second circuit board 70 and the vertical grooves 610, 612 of the lower insulator 60.

The electrical connection between the second circuit board 70 and the lower contact 50 also has increased reliability because of the redundancy provided. In particular, the LED module 10 is still capable of functioning even if the electrical connection at the first circuit board gripping element 500 or the second circuit board gripping element 520 is interrupted.

The second circuit board 70 also has a first upper contact pad 706 and a second upper contact pad 708. The upper contact pads 706, 708 are generally rectangular in shape and are located on the first side 700 of the second circuit board 70. Largely identical first and second upper contact pads 716, 718 are also located on the second side 710 of the second circuit board 70. The first and second pairs of upper contact pads 706, 716 and 708, 718 are positioned near the upper edge 720 of the second circuit board 70, one in the vicinity of the first side edge 740 and one in the vicinity of the second side edge 750. Both are positioned approximately equal distance from their respective side edges to maintain the mirror image and redundancy features of the second circuit board 70.

The second circuit board 70 also has a third upper contact pad 709 located on its first side 700 and a largely identical third upper contact pad 719 located on its second side. The pair of third upper contact pads 709, 719 are positioned near the upper edge 720 of the second circuit board 70 approximately halfway between the side edges 740, 750. While also generally rectangular in shape, the third pair of upper contact pads 709, 719 are, preferably, larger than the first and second pairs of lower contact pads 702, 712 and 704, 714 and the first and second pairs of upper contact pads 706, 716 and 708, 718.

The upper and lower pairs of contact pads are preferably plated with gold, or another electrically conductive and corrosion resistant material.

Figure 16:
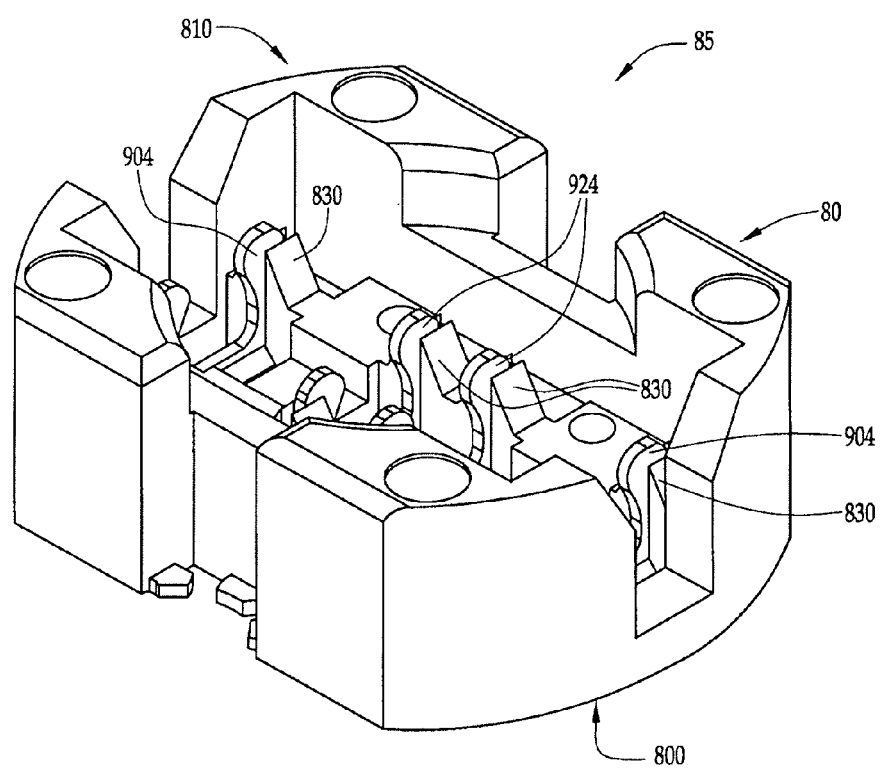
FIG. 16 is a perspective view of the upper assembly of FIG. 3.
Figure 17:
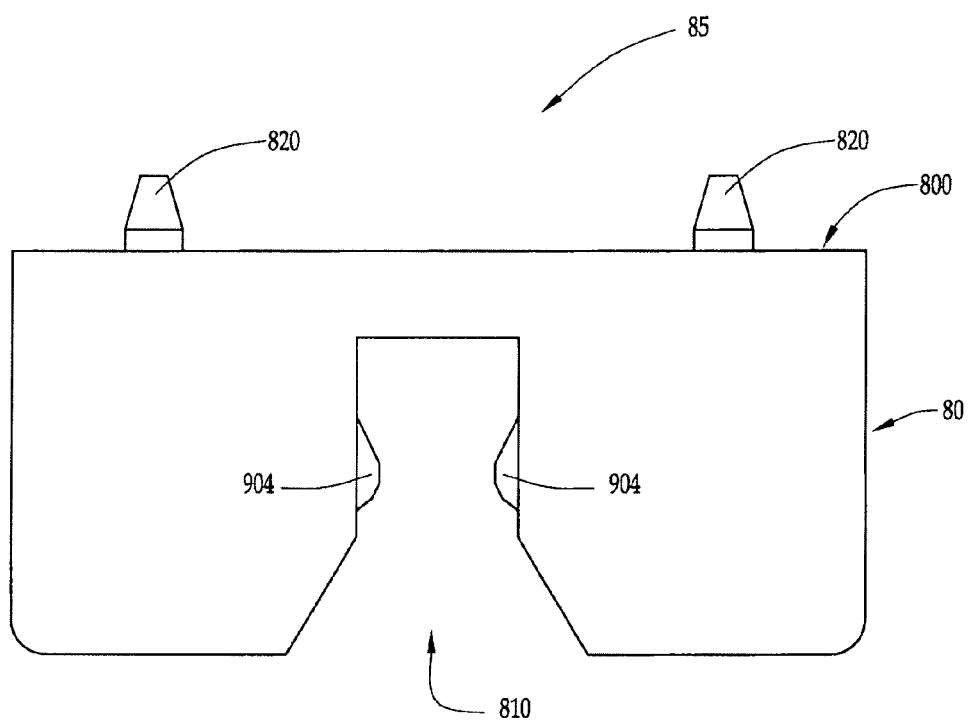
FIG. 17 is a side view of the upper assembly of FIG. 3.
Figure 18:
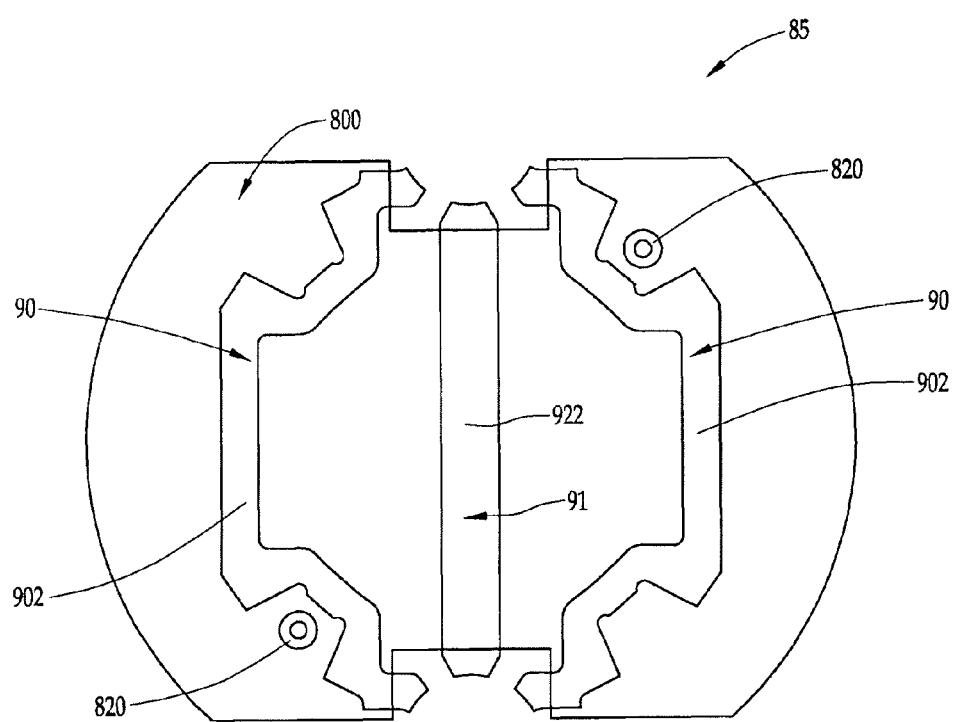
FIG. 18 is a top view of the upper assembly of FIG. 3.

The upper assembly 85 of the preferred embodiment (comprising the upper insulator 80 and the upper contacts 90, 91) is now described. As shown in FIGS. 16-18, the upper insulator 80 of the preferred embodiment is formed from a non-electrically and non-thermally conductive material, preferably a liquid crystal polymer that is capable of withstanding elevated temperature. The upper contacts 90, 91 are preferably made from beryllium copper, or another electrically conductive material. The upper insulator 80 is preferably injection molded around the upper contacts 90, 91, forming the upper assembly 85.

The upper assembly 85 has an upper surface 800 and a lower side 810. The upper surface 800 is generally oval in shape with a generally flat surface. A pair of ground upper contacts 90 are exposed on the upper surface 800 of the upper assembly 85, with one upper contact 90 being disposed approximately midway between the periphery and the transverse centerline of the upper insulator 80 (on one side of the transverse centerline) and the other upper contact 90 being disposed approximately midway between the periphery and the transverse centerline of the upper insulator 80 (on the opposite side of the transverse centerline). A positive upper contact 91 is preferably exposed on upper surface 800 along the transverse centerline of the upper insulator 80. None of the upper contacts 90, 91 are in physical contact with each other.

The positive and negative terminals 370, 375, 380 on the lower surface 305 of the first circuit board 30 are attached to the exposed portion of the upper contacts 90, 91 by a screen applied solder paste, which is then sent through a reflow oven. This preferably occurs after the lower surface 210 of the LED 20 and the lower surface 415 of the contact ring 40 have been attached to the upper surface 300 of the first circuit board 30.

The lower surface 305 of the first circuit board 30 is oriented relative to the upper contacts 90, 91 so that the positive terminal 370 on the lower surface 305 of the first circuit board 30 is located above, and in alignment with, the exposed portion of upper contact 91, the first negative terminal 375 on the lower surface 305 of the first circuit board 30 is located above the exposed portion of one of the pair of upper ground contacts 90, and the second negative terminal 380 on the lower surface 305 of the first circuit board 30 is located above the exposed portion of the other upper ground contact 90 exposed on the upper surface 800 of the upper assembly 85. The positive terminal 370 is therefore in electrical communication with the upper contact 90, the first negative terminal 375 is in electrical communication with one upper contact 90, and the second negative terminal 380 is in electrical communication with the other contact 90. The foregoing configuration permits the first circuit board 30 to be oriented relative to the upper surface 800 in either of two possible orientations.

The orientation of the first circuit board 30 relative to the upper contacts 90, 91 in one of two possible orientations is aided by two alignment pegs 820 that extend away from the upper surface 800 of the upper insulator 80. These pegs 820 engage the corresponding alignment holes 399 in the first circuit board 30.

The electrical connection between the first circuit board 30 and the upper contacts 90 also has increased reliability because of the redundancy provided. In particular, the module 10 is still capable of functioning if either of the upper ground contacts 90 are interrupted.

The upper surface 800 of the upper assembly 85 is more oval shaped and somewhat larger than the lower surface 305 of the first circuit board 30. As a result, those portions of the upper surface 800 of the upper assembly 85 that are not covered by the lower surface 305 of the first circuit board 30 are covered by the fins 450, 455 that emanate outward from the side portions 440, 445 of the contact ring 40.

Upper ground contacts 90 have a main portion 902, which is embedded in the upper insulator 80 and exposed on the upper surface 800, and a circuit board gripping element 904 for gripping the second circuit board 70 similar to those described in connection with the lower contact 50. The upper contact 91 has a main portion 922, which is embedded in the upper insulator 80 and exposed on the upper surface 800, and a pair of circuit board gripping elements 924 similar to those described in connection with the lower contact 50.

After molding of the upper assembly 85 is completed, the circuit board gripping elements 904 of the upper contacts 90 protrude below the lower side 810 of the upper insulator 80 generally below the main portions 902 of the upper contacts 90. Similarly, the circuit board gripping elements 924 protrude below the lower side 810 of the upper insulator 80 generally below the main portion 922 of the upper contact 91.

The upper assembly 85 also has support elements 830 that protrude below the lower side 810 of the upper insulator 80 and that are configured to prevent the circuit board gripping elements 904, 924 from being bent upon insertion of the second circuit board 70.

Upon assembly of the module 10, the first pair of upper contact pads 706, 716 of the second circuit board 70 are engaged by the prongs of circuit board gripping element 904 of one of the upper contacts 90, while the second pair of upper contact pads 708, 718 of the second circuit board 70 are engaged by the prongs of the circuit board gripping element 904 of the other upper contact 90. Similarly, the third pair of upper contact pads 709, 719 of the second circuit board 70 are engaged by the prongs of the pair of circuit board gripping elements 924 of upper contact 91. The first pair of upper contact pads 706, 716 are therefore in electrical communication with one of the upper contacts 90, the second pair of upper contact pads 708, 718 are in electrical communication with the other upper contact 90, and the third pair of upper contact pads 709, 719 are in electrical communication with the upper contact 91 via the pair of circuit board gripping elements 924.

The assembly process is simplified because the upper contact pads 706, 716, 708, 718 and 709, 719 are, preferably, substantially larger than the width of the respective circuit board gripping elements 904, 924 of the upper contacts 90, 91. Manufacturing tolerances, therefore, need not be as stringent. Further, the above configuration also permits the upper assembly 85 to be installed on the second circuit board 70 in either of the two possible orientations.

The physical connection between the second circuit board 70 and the upper contacts 90, 91 also has increased stability. In particular, circuit board gripping elements 904 of the upper contacts 90 are spaced apart from each other, on opposite sides of the longitudinal centerline of the second circuit board 70. Stability is also increased by the circuit board gripping elements 924 that engage the third pair of upper contacts 709, 719.

The electrical connection between the second circuit board 70 and the upper contacts 90, 91 also has increased reliability because of the redundancy provided by the pair of circuit board gripping elements 904 and the pair of circuit board gripping elements 924. In particular, the LED module 10 is still capable of functioning if the connection at one of the circuit board gripping elements 904 or one of the circuit board gripping elements 924 is interrupted.

As best seen in FIG. 4, the two pairs of prongs 614, 616 that protrude from the upper edge 604 of the lower insulator 50 aid in the alignment of the upper assembly 85 relative to the lower assembly 55 and the second circuit board 70. The prongs 614, 616 also prevent movement of the lower assembly 55 relative to the upper assembly 85, thereby preventing twisting of the second circuit board 70.

A heat sink 101 of the present embodiment comprises contact ring 40 and outer housing 100, preferably made of metal. Outer housing 100 of the present embodiment is generally cylindrical in shape and has a circumferential wall 110 with an upper lip 112 and a lower edge 114. The upper lip 112 defines a generally circular upper opening 116 and the lower edge 114 defines a generally circular lower opening 118. Within the circumferential wall is a central cavity.

The circumferential wall 110 is generally circular in shape with a uniform thickness. The diameter of the circumferential wall 110, at any point from the upper lip 112 to lower edge 114, is only slightly larger than the corresponding diameter of the outer surface 602 of the circumferential wall 600 of the lower insulator 60. However, there is no corresponding circumferential groove 606.

The LED 20, the first circuit board 30, the contact ring 40, the lower insulator 60 (with lower contact 50), and the upper insulator 80 (with upper contacts 90, 91) can therefore be inserted into the central cavity of the heat sink 100 via the lower opening 118. Upon full insertion, the LED 20 and a portion of the contact ring 40 are exposed through the upper opening 116. In this position, the lower edge 114 of the circumferential wall 110 is supported by the circumferential ledge 622 of the lower insulator 60. The outer housing 100 is then secured in this position to the lower insulator 60 by inwardly crimping the circumferential wall 110 of the outer housing 100 where it overlays the circumferential groove 606 in the lower insulator 60.

Upon assembly, the outer housing 100 is in physical, electrical, and thermal communication with the contact ring 40. In particular, the upper lip 112 is in physical contact with, at least, the multiple fins 450, 455 of the contact ring 40. This physical, electrical, and thermal communication may be improved by injecting solder paste into two access notches 120 in the upper lip 112, on opposite sides of the upper opening 116, located directly above the multiple fins 450, 455 of the contact ring 40 and then running the entire LED module 10 through a reflow oven. However, a lower temperature solder composition (e.g., a solder composition with a lower solidus temperature and/or a lower liquidus temperature) is preferably used so that the temperature of the reflow oven may be preferably lower than the oven used to attach the LED 20, and preferably below the solidus temperature of the solder composition used to solder the contact ring 40 and the upper contacts 90, 91 to the first circuit board 30.

The outer housing 100 is made from an electrically and thermally conductive material, preferably nickel plated aluminum.

Figure 19:
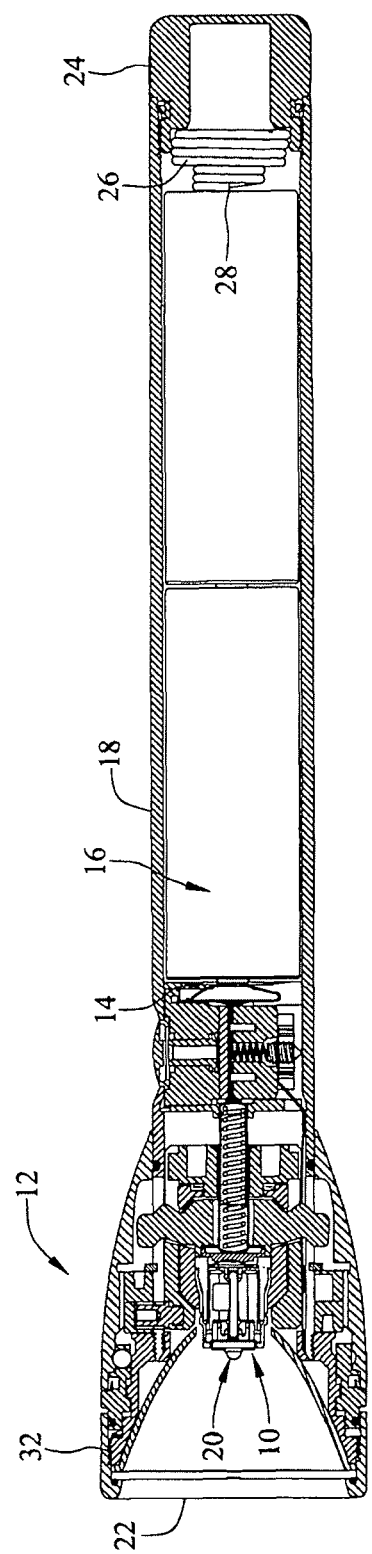
FIG. 19 is a cross-sectional view of a flashlight equipped with an LED module having features in accordance with the present invention.
Figure 20:
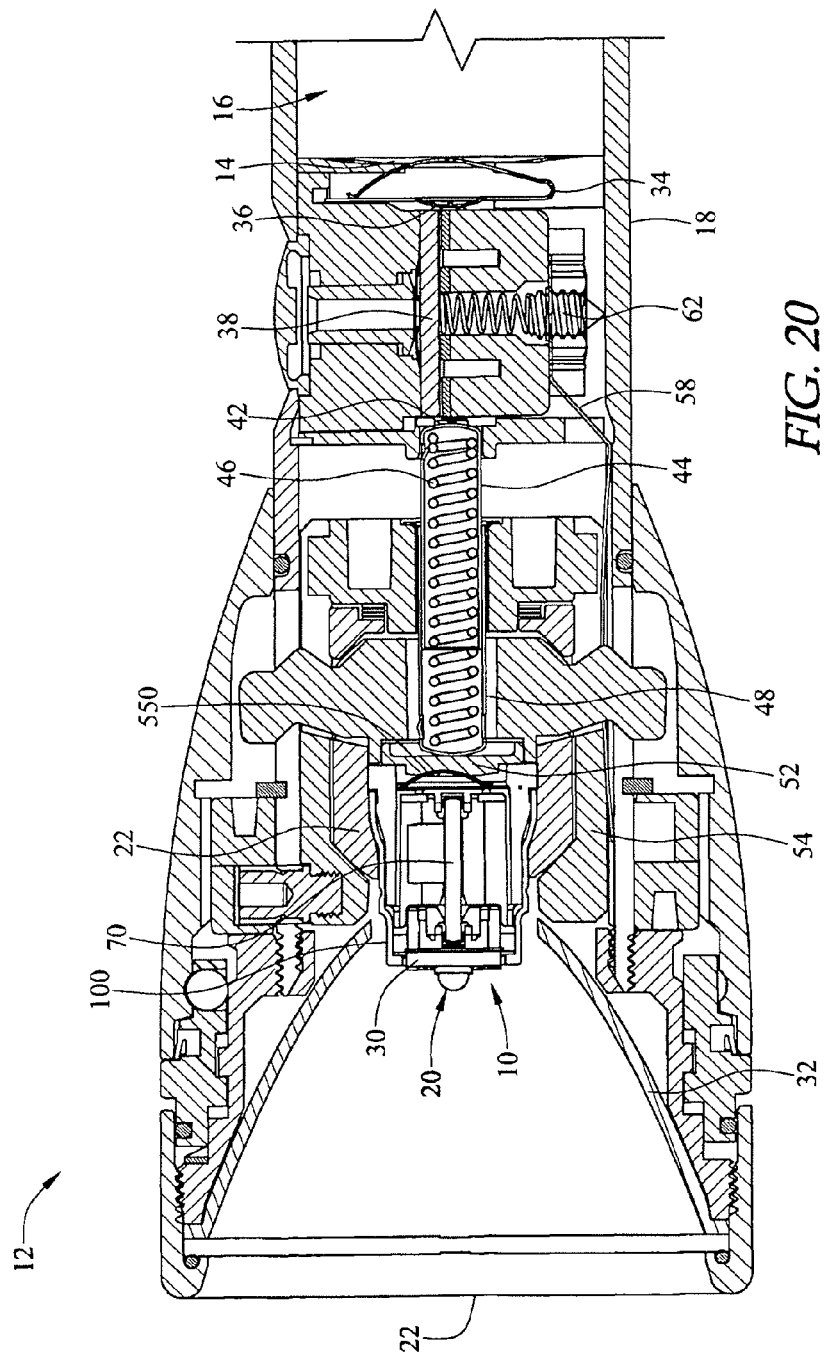
FIG. 20 is an enlarged cross-sectional view of a flashlight equipped with an LED module having features in accordance with the present invention.

LED modules according to the present invention may be used in a variety of lighting devices, including portable lighting devices such as flashlights and headlamps. As shown in FIGS. 19-20, for example, the LED module 10 may be positioned so that an anode terminal 14 of a power source 16 (e.g., one or more batteries) of a flashlight 12 is in electrical communication with the leaf spring 550 of the lower contact 50, and the outer housing 100 is in electrical communication with the cathode terminal 28 of the power source 16. Although FIGS. 19-20 show the anode terminal 14 in electrical communication with the leaf spring 550 through an electrically conductive pathway that includes several structures, the module 10 can be alternatively positioned so that the anode terminal 14 is in electrical communication with the leaf spring 550 through any other electrically conductive pathway, including direct physical contact. Similarly, although FIGS. 19-20 show the outer housing 100 in electrical communication with the cathode terminal 28 through an electrically conductive pathway that includes several structures (including the barrel 18), the module 10 can be alternatively positioned so that the outer housing 100 is in electrical communication with the cathode terminal 28 through any other electrically conductive pathway, including direct physical contact with the barrel 18. The LED 20 is positioned within the reflector 32 of the flashlight to project light through the lens 22.

It to be expressly understood that the present invention is not restricted to the flashlight 12 described herein. Further, as will become apparent to those skilled in the art after reviewing the present disclosure, one or more aspects of the LED module 10 may also be incorporated into other portable lighting devices, including, for example, headlamps.

The flow of thermal energy away from the LED 20 in the preferred embodiment will now be described. Heat generated by the LED diode 220 is transferred through the heat pad on the lower surface 210 of the LED 20 to the thermal pad 325 on the upper surface 300 of the first circuit board 30. Heat is then transferred from the thermal pad 325, through the multiple parallel high copper content layers 385-388 and thermal vias 390, 395 of the first circuit board 30, and into the main body 405 of the contact ring 40. The heat is then transferred from the main body 405 of the contact ring 40, through its side portions 440, 445, and into its fins 450, 455. From the fins 450, 455, heat is then transferred into the outer housing 100. However, heat is also transferred directly from the main body 405 of the contact ring 40 to the outer housing 100 of the heat sink 101 via the solder joints formed in the vicinity of the two access notches 120. One option is to then transfer the heat from the outer housing 100 into the barrel 18 of a flashlight 12 or other large thermally conductive body of the lighting device.

The flow of energy through a flashlight 12 equipped with the LED module 10 will now be described. Electrical energy is produced in one or more batteries 16. From the anode terminal 14 of the foremost battery, electricity flows (through an electrically conductive pathway that can include snap in contact 34, L-shaped contact 36, assembled circuit board 38, L-shaped contact 42, inner contact sleeve 44, spring 46, outer contact sleeve 48, and compact disc 52) into the LED module 10 through the leaf spring 550 of the lower contact 50. Electricity then flows out of the lower contact 50 and into the second circuit board 70 through the electrical connection formed between the circuit board gripping elements 500, 520 of the lower contact 50 and the first and second pairs of lower contact pads 702, 712 and 704, 714 near the lower edge 730 of the second circuit board 70. Electrical energy then flows out of the second circuit board 70 and into the upper contact 91 through the electrical connection formed between the third pair of upper contact pads 709, 719 near the upper edge 720 of the second circuit board 70 and the pair of circuit board gripping elements 924 of the upper contact 91. Electrical energy then flows out of the main portion 922 of the upper contact 91 and into the first circuit board 30 through the positive terminal 370 on its lower surface 305. Electrical energy then flows through the first circuit board 30 using electrical via 397 and enters the LED diode 220 through the solder bond between positive terminal 315 and the positive contact on the lower surface 210 of the LED 20, where electrical energy then flows through the diode 220, to produce light.

From the LED diode 220, electrical energy exits the LED 20 and flows back into the upper circuit board 30 through the solder bond between the negative contact on the lower surface 210 of the LED 20 and negative terminal 320 of the first circuit board 30. Electrical energy then flows from the first circuit board 30 into the contact ring 50 through the solder joint formed between the first and second landings 300, 335 on the upper surface 300 of the first circuit board 30 and the first and second wide portions 420, 425 of the main body 405 of the contact ring 40 portion of the heat sink 101. Electrical energy then flows from the contact ring 40 to the outer housing 100 of the heat sink 101, and then to the barrel 18 (through an electrically conductive pathway that can include ball 22, ball housing 54, ground contact 58, and set screw 62) or other source of electrical connection of the flashlight 12. From the barrel 18, or through another electrical connection, electrical energy flows into the tail cap 24, through the tail cap spring 26, and into the cathode terminal 28 of the rearmost battery, thereby completing the circuit.

Additionally, the first circuit board 30 provides a ground for the second circuit board 70. The ground connection runs from negative terminal 320 on the upper surface 300 of the first circuit board 30, through electrical vias 398, to negative terminals 375, 380 on the lower surface of first circuit board 30. The negative terminals 375, 380 are, in turn, in electrical communication with upper contacts 90 which are, in turn, in electrical communication with the second circuit board 70 through the electrical connection formed between the two circuit board gripping elements 904 and first and second pairs of upper contact pads 706, 716 and 708, 718.

While a preferred embodiment of an improved LED module and its respective components have been presented in the foregoing disclosure, numerous modifications, alterations, alternate embodiments, and alternate materials may be contemplated by those skilled in the art and may be utilized in accomplishing the various aspects of the present invention. Thus, it is to be clearly understood that this description is made only by way of example and not as a limitation on the scope of the invention as claimed below. Moreover, while directional terms such as upper and lower have been used to facilitate the description of the preferred embodiment, the relative orientation of the components of the preferred embodiment are not meant to be so limited.

What is claimed is:

1. A lighting module, comprising:
a circuit board;
a light emitting diode attached to said circuit board with solder; and
a heat sink attached to said circuit board with solder;
wherein said heat sink comprises an outer housing.

2. The lighting module of claim 1, wherein said circuit board has a plurality of thermally conductive layers.

3. The lighting module of claim 2, wherein two or more of said plurality of thermally conductive layers are connected by vias.

4. The lighting module of claim 3, wherein one or more of said vias are blind vias.

5. The lighting module of claim 1, wherein said heat sink is in thermal and electrical communication with said light emitting diode through said circuit board.

6. The lighting module of claim 1, wherein said lighting module further comprises a second circuit board, and said second circuit board is in electrical communication with said circuit board.

7. The lighting module of claim 6, wherein said second circuit board controls said light emitting diode.

8. The lighting module of claim 7, wherein said second circuit board serves as an electronic switch for said light emitting diode.

9. The lighting module of claim 6, wherein said second circuit board is in electrical communication with said circuit board through a plurality of electrical connectors.

10. The lighting module of claim 9, wherein two or more of said plurality of electrical conductors are equally spaced relative to the longitudinal centerline of said second circuit board.

11. The lighting module of claim 6, wherein said second circuit board is capable of maintaining electrical communication with said circuit board in a plurality of orientations relative to said circuit board.

12. The lighting module of claim 6, wherein said lighting module further comprises a contact, and said contact is in electrical communication with said second circuit board.

13. The lighting module of claim 12, wherein said contact is in electrical communication with said second circuit board through a plurality of electrical connectors.

14. The lighting module of claim 13, wherein two or more of said plurality of electrical conductors are equally spaced relative to the longitudinal centerline of said second circuit board.

15. A lighting module, comprising:
a thermally conductive circuit board;
a light emitting diode attached to said thermally conductive circuit board with a first solder composition; and
a heat sink, comprising a thermally conductive member and an outer housing, attached to said thermally conductive circuit board with a second solder composition;
wherein said thermally conductive member is attached to said outer housing with a third solder composition, said third solder composition having a liquidous temperature lower than the liquidous temperature of said first and said second solder compositions.

16. The lighting module of claim 15, wherein said first solder composition and said second solder composition are identical.

17. The lighting module of claim 16, wherein said light emitting diode is in electrical communication with said heat sink.

18. A lighting device, comprising:
a body; and
a lighting module, housed within the body, comprising a light emitting diode, a circuit board, and a heat sink;
wherein said light emitting diode is attached to said circuit board with solder;
wherein said heat sink is attached to said circuit board with solder; and
wherein said heat sink is in electrical communication with said body and said light emitting diode.

19. The lighting device of claim 18, wherein said body houses a power source having an anode contact and a cathode contact, wherein said lighting module further comprises a contact in electrical communication with said circuit board, and wherein said lighting module is configured to prevent electrical communication between said cathode contact of said power source and said contact of said lighting module, while allowing electrical communication between said anode contact of said power source and said contact of said lighting module.

20. The lighting device of claim 19, wherein said contact of said lighting module is a leaf spring.

* * * * *